(12) United States Patent
Barrow

(10) Patent No.: US 6,545,514 B2
(45) Date of Patent: *Apr. 8, 2003

(54) DRIVE CIRCUIT FOR INDUCTIVE LOADS

(75) Inventor: Jeffrey G. Barrow, Oak Ridge, NC (US)

(73) Assignee: STMicroelectronics N.V. (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,252

(22) Filed: Apr. 26, 1999

(65) Prior Publication Data

US 2002/0027456 A1 Mar. 7, 2002

(51) Int. Cl.[7] .................................................. H03B 1/00
(52) U.S. Cl. ........................ 327/110; 327/424; 327/588; 360/46; 360/68
(58) Field of Search ........................ 327/118–110, 423, 327/424, 448, 508, 111, 588; 363/63, 58; 330/146; 360/68, 67, 46

(56) References Cited

U.S. PATENT DOCUMENTS

| 5,287,231 A | | 2/1994 | Shier et al. ..................... 360/68 |
|---|---|---|---|
| 5,333,081 A | * | 7/1994 | Mitsui .......................... 360/46 |
| 5,638,012 A | * | 6/1997 | Hashimoto et al. .......... 327/110 |
| 5,818,211 A | | 10/1998 | Narasawa et al. ........... 323/312 |
| 5,869,988 A | | 2/1999 | Jusuf et al. .................. 327/110 |
| 6,121,800 A | * | 9/2000 | Leighton et al. ............. 327/110 |

* cited by examiner

Primary Examiner—Timothy P. Callahan
Assistant Examiner—Minh Nguyen
(74) Attorney, Agent, or Firm—Lisa K. Jorgenson; William J. Kubida

(57) ABSTRACT

An inductive load driver circuit including a first switch that switches between a conductive state and a non-conductive state selectively applies a first power supply potential to a first side of the inductive load in response to a control signal. A second switch that switches between a non-conductive state and a conductive state selectively applies a second power supply potential to a second side of the inductive load in response to the control signal. The control signal places a control node of the second switch at a lower potential than the second side of the inductive load while the second switch is in the conductive state. In operation, a steady state current in a first direction is driven through the inductive load. The nodes of the inductive load are placed in a high impedance state, after which a steady state current is driven in a second direction through the inductive load.

22 Claims, 9 Drawing Sheets

DRIVE CIRCUIT FOR INDUCTIVE LOADS

BACKGROUND OF THE INVENTION

1. Field of the Invention

The present invention relates, in general, to a driver circuit for generating current to an inductive load, and, more particularly, to a circuit used to drive a write coil of a read/write head for a hard disk drive.

2. Relevant Background

The computer marketplace continues to demand higher capacity and faster performance from data storage device such as hard disks and tape drives. Because of increased application file sizes, advanced operating systems, and multimedia applications, demand for hard disk drive capacity, for example, is doubling every year. This trend has pushed entry level drive capacities above several gigabyte (GB) levels. Technologies for storing and retrieving data from magnetic media must also be cost effective. Because lower cost per megabyte (MB) is also desired, the prior practice of simply adding more disks and heads to a hard drive is less and less effective.

Disk drives store binary encoded information as regions of magnetic flux on a media having a magnetic surface coating. It is desirable that these magnetic regions be encoded on the disk as densely as practical, so that a maximum amount of information may be stored. Disk and tape drive suppliers continue to increase areal densities, or the number of data bits per square inch, to meet the increasing demand for storage at competitive pricing. However, increasing areal density requires the write mechanism to produce smaller recorded patterns on the disk. Write head design and write driver design are key technologies needed to achieve these capacity increases.

To compensate for the weaker signals caused by smaller regions of magnetic flux for each byte, read heads are designed to fly only a few microinches from the magnetic media. Because this distance is already much less than the size of a dust particle, it is unlikely that further improvements can be achieved by moving the heads closer to the media. Moreover, reliability becomes a significant concern as the heads are moved closer to the media.

The magnetic regions are created by passing current through a coil of a magnetic write head. Binary data can be encoded by switching the polarity of the current through the write coil.

The current in the write coil is provided by a write head driver circuit and must be carefully controlled. The data rate (i.e., the rate at which bits can be written onto the media) is determined largely by the rate at which the current can be switched in the write head driver circuit. It is desirable to have a write head drive circuit that quickly switches current to the desired polarity and magnitude to support high disk rotation speeds with small magnetic regions. Also, the driver circuit must raise the current amplitude to a level sufficient to ensure the flux generated by the write coil is adequate to saturate the magnetic media while limiting the current below levels that will result in "blooming" of the written magnetic region into adjacent regions of the media.

Due to the inductive nature of a write circuit head and the parasitic capacitance(s) and resistance(s) associated with the write circuitry, ringing effects occur in the write current signal which tends to delay the settling of the write current to its final DC value. These ringing effects are seen as overshoot and undershoot. Overshoot can be tolerated to a large extent, but in the extreme will result in writing data to adjacent regions. Undershoot is usually undesirable as the undershoot may result in writing a bit of the opposite polarity than is intended at either the target location or an adjacent location. Hence, ringing can adversely affect precise placement of the magnetic region on the magnetic media and areal density.

In conventional driver circuits, ringing is worsened by higher slew rates. Higher slew rates increase the magnitude of the ringing and make it more difficult to control. One option when ringing effects are present is to simply wait for the write current to settle to a steady state value before enabling the next transition for encoding a bit. However, this decreases the areal the density of bit encoding by the write circuit and so is undesirable.

Other approaches to control ringing use active circuits to generate cancellation currents that limit overshoot and undershoot. This approach maintains acceptable encoding density, but increases circuit complexity and cost. Also, delays associated with the active circuitry tend to limit the effectiveness of this approach and slow the slew rate.

A conventional write driver circuit comprises an H-bridge configuration using four switches. In an H-bridge circuit, one leg of the bridge is always trying to drive current into the inductive load. In other words, the H-bridge is always coupling the power supply voltage onto one of the inductor nodes and ground to the other inductor node by appropriately activating the bridge switches. Although the switching devices that make up an H-bridge circuit can be made very fast, so long as the H-bridge is trying to drive current into the inductor, the slew rate of current through the inductor is limited by inductor physics.

The slew rate is governed by a fundamental equation describing current when voltage is applied to an inductor:

$$V = L\frac{di}{dt}, \text{ which can be rewritten as: } \frac{V}{L} = \frac{di}{dt}$$

Given a write head where the inductance (L) is predetermined, the only way to increase slew rate (di/dt) is to increase the voltage (V) applied across the inductor. However, in practical electronic systems the available voltage is limited to the supply voltages provided by the system (e.g., 5.0 V in a personal computer system). Moreover, increasing the voltage is often not possible due to the limitations of the semiconductor devices used to implement the write driver circuit.

Another limitation of H-bridge drivers is that parasitic device elements, namely parasitic capacitances associated with switching transistors, are coupled so as to oppose rapid current switching in the load. Charging the parasitic elements, which must occur before switching can occur, robs current from the load thereby lowering the di/dt from its theoretical maximum.

Hence, a need exists for a circuit for driving inductive loads, and particularly a circuit for driving write heads in a magnetic recording media that provides high slew rate with controlled ringing. Moreover, a need exists for a high slew rate driver circuit that does not require excessive voltages or additional voltage supplies, and that can be implemented using simple, low cost circuitry.

SUMMARY OF THE INVENTION

Briefly stated, the present invention involves an inductive load driver circuit including a first switch that switches between a conductive state and a non-conductive state selectively applies a first power supply potential to a first side of the inductive load in response to a control signal. A second switch that switches between a non-conductive state and a conductive state selectively applies a second power supply potential to a second side of the inductive load in response to the control signal. The control signal places a control node of the second switch at a lower potential than the second side of the inductive load while the second switch is in the conductive state. In operation, a steady state current in a first direction is driven through the inductive load. The nodes of the inductive load are placed in a high impedance state, after which a steady state current is driven in a second direction through the inductive load.

DETAILED DESCRIPTION OF THE PREFERRED EMBODIMENTS

Figure 1:
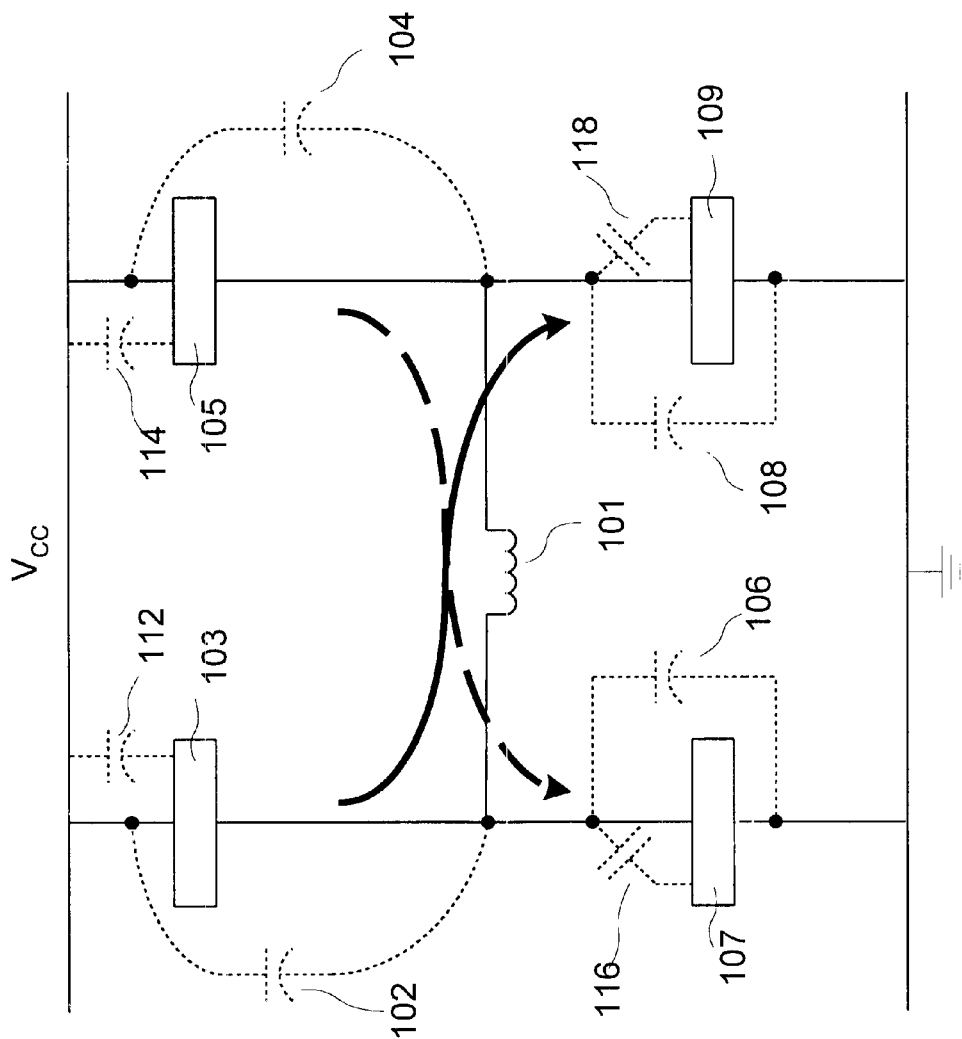
FIG. 1 illustrates an H-bridge driver circuit in accordance with the prior art.

The principles of the present invention are applied in specific implementations of write head drivers for hard disk drives, it is apparent that the principles are readily applied to any inductive load driver. For example, audio speakers are driven by inductive coils and the quality of sound reproduction can be affected by the slew rate (di/dt) and harmonics of the speaker driver. Likewise, television and raster displays, precision motor controllers, and power supplies benefit from the efficient high quality drive current provided in accordance with the present invention. Also, laser diode drivers and light emitting diodes for fiber optic communications benefit from a current driver with high di/dt. The specific teachings of the present invention are readily adapted to these and other applications that involve current switching.

Although the present invention is described in terms of several specific embodiments, it is important to the appreciation of the inventive concepts to understand a few fundamental principles behind the various embodiments. First, it has been found that it is possible to achieve a much higher rate in change of current (di/dt) by turning off current through an inductor than is practical by applying higher voltage while turning on current through an inductor. Second, it has been found that parasitic capacitors, resistors, and switches that are inherent in any circuit design not only cause ringing problems, but also rob current from portions of the circuit that are doing useful work. Through application of these principles to various driver circuits, a high skew, low ring driver is provided without increasing voltage requirements of the circuits.

With respect to the first principle, the limitations of driving an inductor to achieve high di/dt through switched application of voltage have been discussed above. Essentially, even with an optimized circuit the di/dt is limited primarily by the magnitude of the supply voltage. However, modern semiconductor switches are capable of turning on and off very quickly, in nanoseconds and picoseconds in some cases. Accordingly, extremely high di/dt occurs when switch turns off current to an inductor. Importantly, this magnitude of this di/dt is primarily determined by the switch speed and not strongly related to the voltage applied to the inductive load when it was energized as in prior designs.

With respect to the second principle, parasitic components rob current from doing useful work by directing it along pathways that either do not reach the load that is being driven, or that in fact destructively interfere with current that is doing work. It has been found that parasitic components in conventional driver circuits are responsible for substantial amounts current flow during critical switching phases. It is common engineering practice to attempt to reduce the effect of parasitic components by minimizing the magnitude of these components (e.g., smaller transistors, "tighter" design rules, and the like). In contrast, various features of the present invention change the effect of parasitic components by coupling the parasitic so they do useful work.

It should be noted that it is often difficult to compare parasitic devices, also referred to as implicit or intrinsic devices, with intentionally placed devices. Often times circuits are described without reference to parasitic devices and ignore their effects on circuit performance. Accordingly, the teachings of the present invention must be compared against prior circuits including the parasitic devices of those prior circuit even where those parasitic devices are not expressly shown or described in the teachings of the prior art. In several implementations of the present invention described herein the parasitic devices are coupled to perform useful work and so are more accurately characterized as implicit or intrinsic devices because their parasitic nature has been transformed.

FIG. 1 illustrates a generalized H-bridge driver of the prior art. Load 101 is indicated as an inductor, but it should be understood that a typical load actually presents a complex impedance of inductance, capacitance and resistance. For ease of illustration these secondary effects are not illustrated or described in FIG. 1. Also, switches 103, 105, 107 and 109 have control nodes that affect the switches state (on or off). These control nodes are not shown to ease illustration and understanding, but are provided in a conventional manner appropriate for a selected switch technology.

In a bipolar implementation, switches 103 and 105 are implemented using PNP transistors and switches 107 and 109 are implemented using NPN transistors. In a CMOS implementation, switches 103 and 105 are implemented using P-channel or PMOS transistors and switches 107 and 109 are implemented using N-channel or NMOS transistors.

In operation, a pair of switches 103 and 109 are turned on at the same time while an opposite pair of switches 105 and 107 are turned off. This forces current through load 101 in the direction indicated by the bold line. The current direction is switched by turning off switches 103 and 109 and turning on switches 105 and 107. Typically either the upper or lower switches, usually the upper switches 103 and 105, include some current regulation mechanism such as current mirror circuitry.

In H-bridge write driver circuits, one significant parasitic include capacitors 102 and 104 that will result from collector-emitter or drain-source capacitance, for example in semiconductor devices. Voltage across a capacitor cannot change instantaneously although current through a capacitor can change instantaneously. Hence, when switches 103 and 105 are turned on current will flow through parasitic capacitors 102 and 104, respectively in the opposite direction of the driven current. This current required by capacitors 102 and 104 robs the load current from reaching load 101. The current drain from capacitors 102 and 104 will continue until the switch 103 or 105 reaches steady state. Steady state occurs when the voltage across the power conducting terminals of a switch is substantially unchanging. Importantly, the supply voltage (Vcc) cannot be fully applied to the load terminals until switching has occurred and the parasitic capacitors 102 and 104 have been charged. Hence, slew rate is degraded by the operation of capacitors 102 and 104.

Parasitic devices 112 and 114 essentially couple the control mechanism (not shown) of switches 103 and 105, respectively, to the power supply node. Because voltage across devices 112 and 114 cannot change instantaneously, these parasitic devices tend to resist a transition from on to off in the associated switches 103 and 105. When switches 103 and 105 are implemented with voltage controlled devices such as field effect transistors (FETs), parasitic devices 112 and 114 hold the voltage of control electrode in an on state until charged. When switches 103 and 105 are implemented with current controlled devices such as bipolar junction transistors (BJTs), parasitic devices 112 and 114 inject current into the control electrode (in the case of NPN transistors) or away from the control electrode (in the case of PNP transistors) until parasitic devices 112 and 114 are charged. The effect of this charge injection is to slow the load current slew rate.

As used herein, the term "charged" in reference to a capacitor means the act of applying charge to a capacitor to change the potential across its nodes. Although reducing the potential across a capacitor is sometimes referred to as discharging, for ease of description the term "charging" as used herein includes both increasing the potential across a capacitor and decreasing the potential across the capacitor. Similarly, the term "energizing" generally refers to supplying current to an inductive load regardless of the polarity of the supplied current.

Parasitic devices 102, 104, 112 and 114 are described as capacitors because in practical circuits these parasitic devices are fundamentally capacitive in nature. However, these parasitic devices are alternatively represented as semiconductor devices such as junction diodes or transistors depending on the switch technology and implementation. It is well known that a semiconductor junction (i.e., a diode) is functionally equivalent to a capacitor in many operational regimes, for example. For convenience, parasitic devices are characterized herein according to their primary affect, but it should be understood that they may be represented as other devices and still have the same circuit affects described herein.

Parasitic devices 106 and 108 are analogous to devices 102 and 104, and affect performance by increase ringing and robbing current from the load. Their presence does oppose turn on of the associated switches 107 and 109, respectively, they rob current from the load in the same manner as capacitors 102 and 104. Parasitic elements 116 and 118 are analogous to devices 112 and 114 and may represent the "Miller" capacitance in bipolar and FET switch implementations.

It will be recalled that switches 107 and 109 are implemented as either NPN or NMOS transistors. In either case, the control electrode voltage is increased to turn the switch on while the goal of turning switch 107 or 109 on is to reduce the voltage on the corresponding node of load 101 to ground. This forward biases the base-to-collector diode in a bipolar implementation or a gate-to-drain capacitor in a MOS implementation. In either case, parasitic elements 116 and 118 tend to couple charge from the associated switch's control node (not shown) to the load 101 during switch turn on. This current opposes the current flow intended by turning on the switch. Accordingly, the load cannot be energized until these parasitic devices have been overcome resulting in slower slew rates.

These effects are complicated in practical circuits because current regulation circuitry in switches 103 and 105 tends to have impose "headroom" constraints that limit the voltage actually applied to load 101. Because less than all of the available supply voltage is actually applied across the load the headroom directly degrades the di/dt in the inductive load. Switches 103 and 104 and their associated current regulation mechanisms can be implemented in MOSFET technology to provide lower headroom requirements. However, CMOS switches can latch up during switching an inductive load 101 due to the flyback voltage produced by load 101 when current is switched off. Specific CMOS device design techniques are described hereinafter in reference to FIG. 6 and FIG. 7 that solve this latch up issue as it applies to a particular implementation of the present invention.

Figure 2:
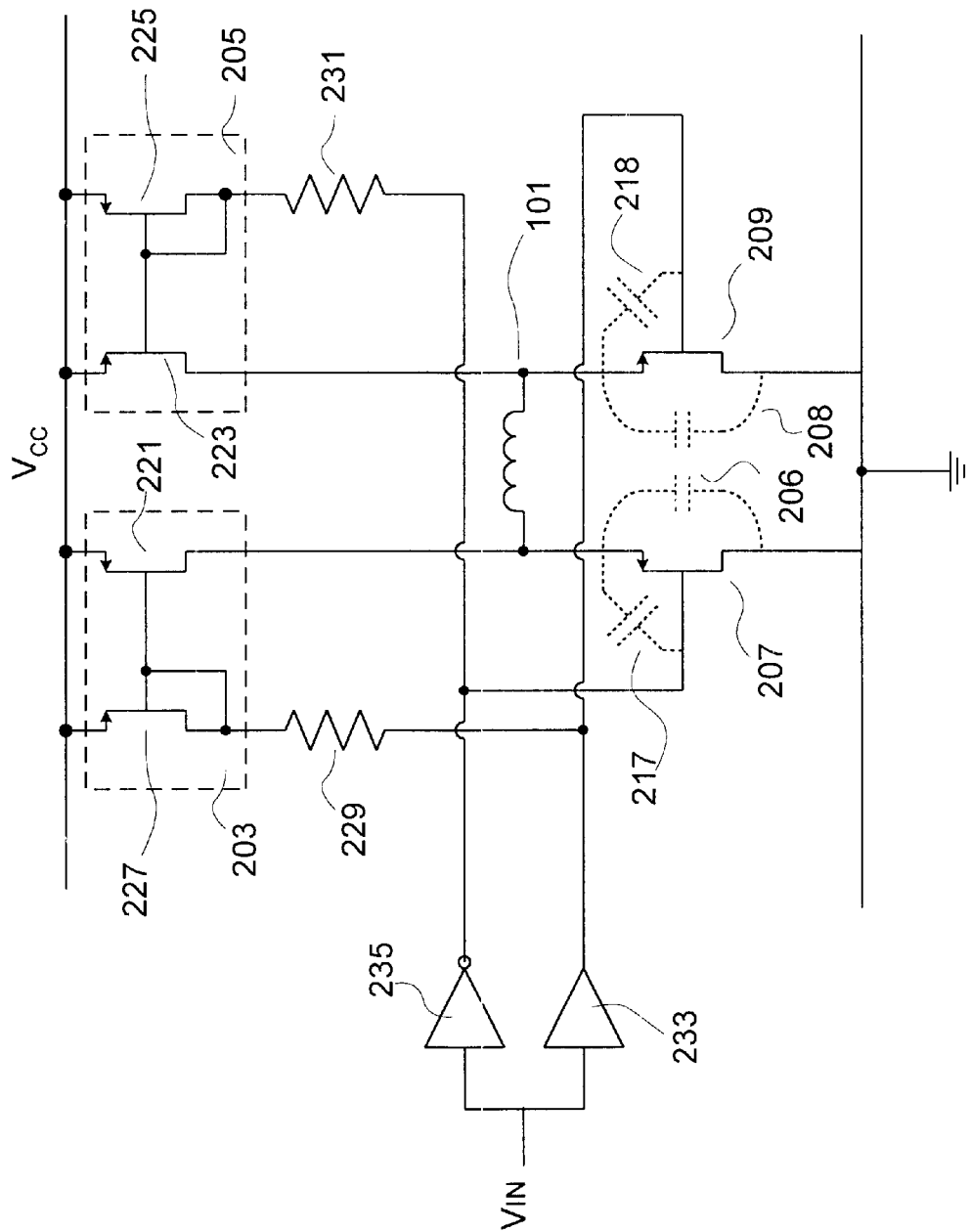
FIG. 2 shows in schematic form a first embodiment driver circuit in accordance with the present invention.
Figure 3:
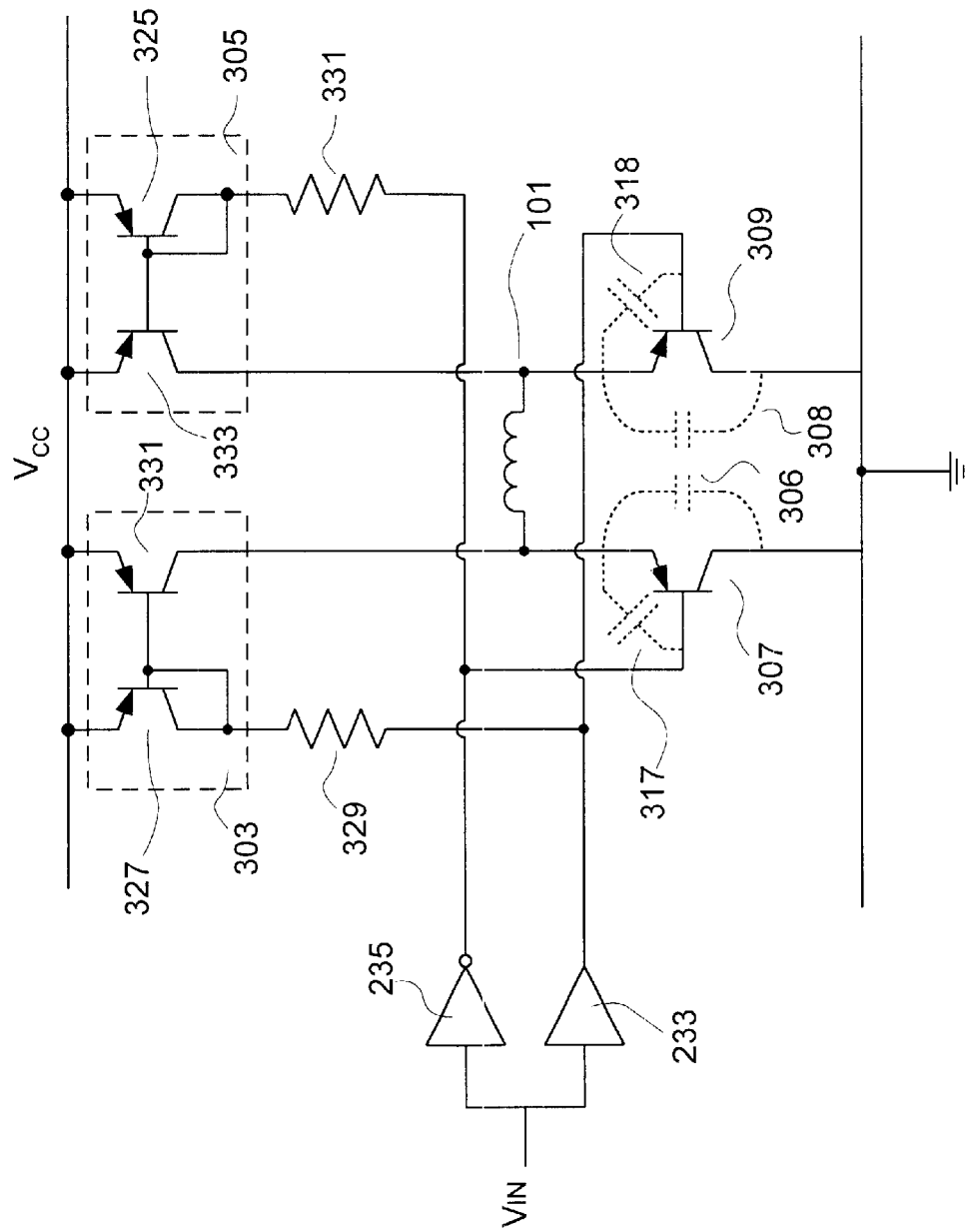
FIG. 3 shows in schematic form a second embodiment driver circuit in accordance with the present invention.

FIG. 2 and FIG. 3 illustrate a first embodiment of the teachings of the present invention. For purposes of discussion, FIG. 2 shows a CMOS implementation whereas FIG. 3 shows a bipolar implementation. In general, the principles of operation are substantially similar between the embodiments shown in FIG. 2 and FIG. 3. The switching process has an ultimate goal of changing the current direction in load 101 from a first steady state condition (e.g., left to right) to a second steady state condition (e.g., right to left). The present invention describes this switching operation as comprising two phases: a first phase in which the forward current is brought from its steady state magnitude to zero and a second phase when the current is turned on in the reverse direction to drive the current from zero to its steady state value in the opposite direction.

In the embodiment of FIG. 2, switch 203 is implemented with PMOS FET 221 that couples power supply Vcc to load 101 and is coupled to a PMOS FET mirror device 227. Load current through mirror device 227, and so also PMOS FET 221, is regulated by the value of resistor 229. In an exemplary circuit resistor 229 is selected to provide a steady state current of about 30 milliamperes (mA).

Switch 205 is analogous to switch 203 in function and design. Switch 205 is implemented with PMOS FET 223 that couples the power supply Vcc to load 101 and is coupled to a PMOS FET mirror device 225. Load current through mirror device 225, and so also PMOS FET 223, is regulated by the value of resistor 231. In an exemplary circuit resistor 231 is selected to provide the steady state current (e.g., about 30 mA).

Differential control signals are generated from an input signal Vin using buffer 233 and inverter 235. Any available means for generating the differential control signal may be used in accordance with the present invention. The control signal from buffer 233 controls the left side switch 203 whereas the control signal from inverter 235 controls the right side switch 205. Essentially, a logic "HIGH" signal (approximately VCC) on the output of either buffer 233 or inverter 235 disables current flow in the associated switch 203 and 205, respectively. A logic "LOW" signal (approximately ground) on the output of either buffer 233 or inverter 235 enables current flow in the associated switch 203 and 205, respectively.

The design and function of switches 203 and 205 shown in FIG. 2 are similar to conventional designs in that they include parasitic capacitance across the drain-source nodes of transistors 221, 223, 225 and 227. Also, parasitic capacitance from the gate electrodes to the power supply node effects circuit performance in the manner similar to elements 112 and 114 shown in FIG. 1.

Unlike prior implementations, switches 207 and 209 are implemented using PMOS transistors rather than conventional NMOS transistors. Conventional circuit design teaches against the use of PMOS devices in the low-side switches because the drain-to-source on-voltage (VDS (on)) of the PMOS device drops some of the voltage otherwise available to load 101. However, this implementation of the present invention achieves advantages over prior designs because the gate-to-source capacitors 217 and 218 are favorably biased during switching. For example, when switching to an on state, the gate node of device 207 is pulled toward ground while its source node is at substantially the supply potential Vcc. Hence, to charge the gate-source capacitance 217 current flows from the source electrode thereby drawing current through load 101 in the desired direction (e.g., the direction that switch 207 will draw current after it is turned on. Switch 209 including implicit capacitor 218 operates in an analogous manner to switch 207.

The operation of parasitic capacitors 206 and 208 in FIG. 2 is substantially similar to devices 106 and 108 described in FIG. 1. The embodiment shown in FIG. 2 essentially replaces parasitic capacitors 117 and 118 shown in FIG. 1 that acted as undesirable charge injection devices with intrinsic capacitors 217 and 218 that serve as desirable charge pumps.

From the perspective of the effective voltage applied across the inductor nodes, assume the circuit of FIG. 2 is operating in steady state with switches 203 and 209 on while switches 205 and 207 are off. In this steady state, the left side of inductor 101 is at a potential substantially equal to ground (e.g., 0 V). Because di/dt is zero in steady state $$\left(V = L\frac{di}{dt}\right),$$

the voltage across inductor 101 is also zero and the right side of inductor 101 is at a potential substantially equal to ground as well.

At the moment of switching, the gate of switch 207 transitions from Vcc to ground while the gate of switch 209 transitions from ground to Vcc. On the left side, the voltage across capacitor 217 cannot change instantaneously, therefor it pulls the left side of inductor 101 toward −Vcc. On the right side, the voltage across capacitor 218 cannot change instantaneously, therefore the right side of inductor 101 is pulled from ground toward Vcc until capacitor 218 is charged. Hence, the transient voltage across inductor 101 is theoretically two times the power supply potential. Taking into consideration practical limitations such as the drain-source on voltage (VDS(on)) of PMOS devices 207 and 209, simulations show that it is possible to achieve 7–9 volts across inductor 101 when Vcc is 5.0 volts. Because slew rate is directly proportional to voltage across inductor 101, this feature of the present invention almost doubles the slew rate of previous designs without requiring an increase in power supply voltage.

While current flows through inductor 101 energy is stored in a magnetic field. When current is stopped, the magnetic field collapses causing a flyback voltage across inductor 101. For example, when current flowing left to right through inductor 101 is switched off, a flyback voltage having a magnitude determined by V=L(di/dt) appears across the terminals of inductor 101. This flyback voltage has the opposite polarity of the pre-switch polarity (i.e., di/dt is negative therefore V is negative). The flyback voltage will persist until the di/dt in the coil falls to zero at which time the field induced voltage across load 101 returns to zero.

This flyback voltage tends to turn switch 207 off by driving the source node of switch 207 to a potential less than the gate voltage. The desirability of this feature is a principle that is somewhat counter intuitive. As discussed hereinbefore, in practical circuits higher di/dt can be achieved by creating an open circuit environment to shut off current flow than is possible by driving current. Accordingly, by turning transistor 207 off during the switching transient, it helps isolate load 101 to create this desired open circuit environment so that current falls more rapidly from the steady state value to zero. Conventional H-bridge designs attempt to drive current in the opposite direction immediately rather than shut of the established current. However, their ability to drive current in the opposite direction is limited by the available supply voltage, and so the di/dt is actually lower than if the open circuit condition is created.

Because it is the reaction of load 101 itself that is placing the low-side switch 207 or 209 in the high impedance state during the transient phase, the circuit operation is automatically synchronized. The high impedance state will remain until the di/dt in inductor 101 is substantially zero which causes the flyback voltage fall to zero. At this point, a second phase of switching begins in which the circuit attempts to drive current in the opposite direction. After the transient phase, current is turned on in the reverse direction (right to left in FIG. 2) and transistor 207 is turned on to conduct this current.

During the first phase of switching PMOS transistor 209 is switched from on to off because gate node of transistor 209 is driven from ground to Vcc by buffer 233. While the source node of switch 209 is more negative than the gate node during the first phase of switching, intrinsic capacitor 218 will inject charge into the right side node of inductor 101. Again, this charge injection is in the desired direction and supports high di/dt in load 101 rather than working against di/dt as in prior solutions.

FIG. 3 illustrates a bipolar implementation of the embodiment shown in FIG. 2. The bipolar implementation may have advantages in certain applications or processing environments. Also, the raised floor effect of PNP bipolar transistors 307 and 309 is less than the corresponding PMOS counterparts shown in FIG. 2. The embodiment shown in FIG. 3 includes switch 303 implemented with PNP 321 that couples power supply Vcc to load 101 and is coupled to a PNP mirror device 327. Load current through mirror device 327, and so also PNP 321, is regulated by the value of resistor 329. Switch 305 is analogous to switch 303 in function and design. Switch 305 is implemented with PNP transistor 323 that couples the power supply Vcc to load 101 and is coupled to a PNP mirror device 325. Load current through mirror device 325, and so also PMOS FET 323, is regulated by the value of resistor 331. Differential control signals are generated using buffer 233 and inverter 235 in the manner described hereinbefore.

Switch 307 and switch 309 are implemented with PNP transistors in contrast with prior bipolar solutions that use NPN transistors for the low-side drivers. A base emitter diode 317 is forward biased when the base of switch 307 is more negative than the emitter (i.e., the left hand node of load 101 ). Similarly, base emitter diode 318 is forward biased when the base of switch 309 is more negative than the emitter (i.e., the right hand node of load 101). Accordingly, when either switch 307 or switch 309 is turned on by driving the corresponding base node to ground, the diode 317 or 318 of the activating PNP becomes forward biased and enables current to flow in the desired direction through load 101. For the switch that is being turned off, the base-emitter diode cannot support a reverse bias voltage until the space charge region within the base emitter junction has depleted. Hence, the transition of the base from ground to Vcc results in the associated node of inductor 101 approaching 2*Vcc.

Figure 4A:
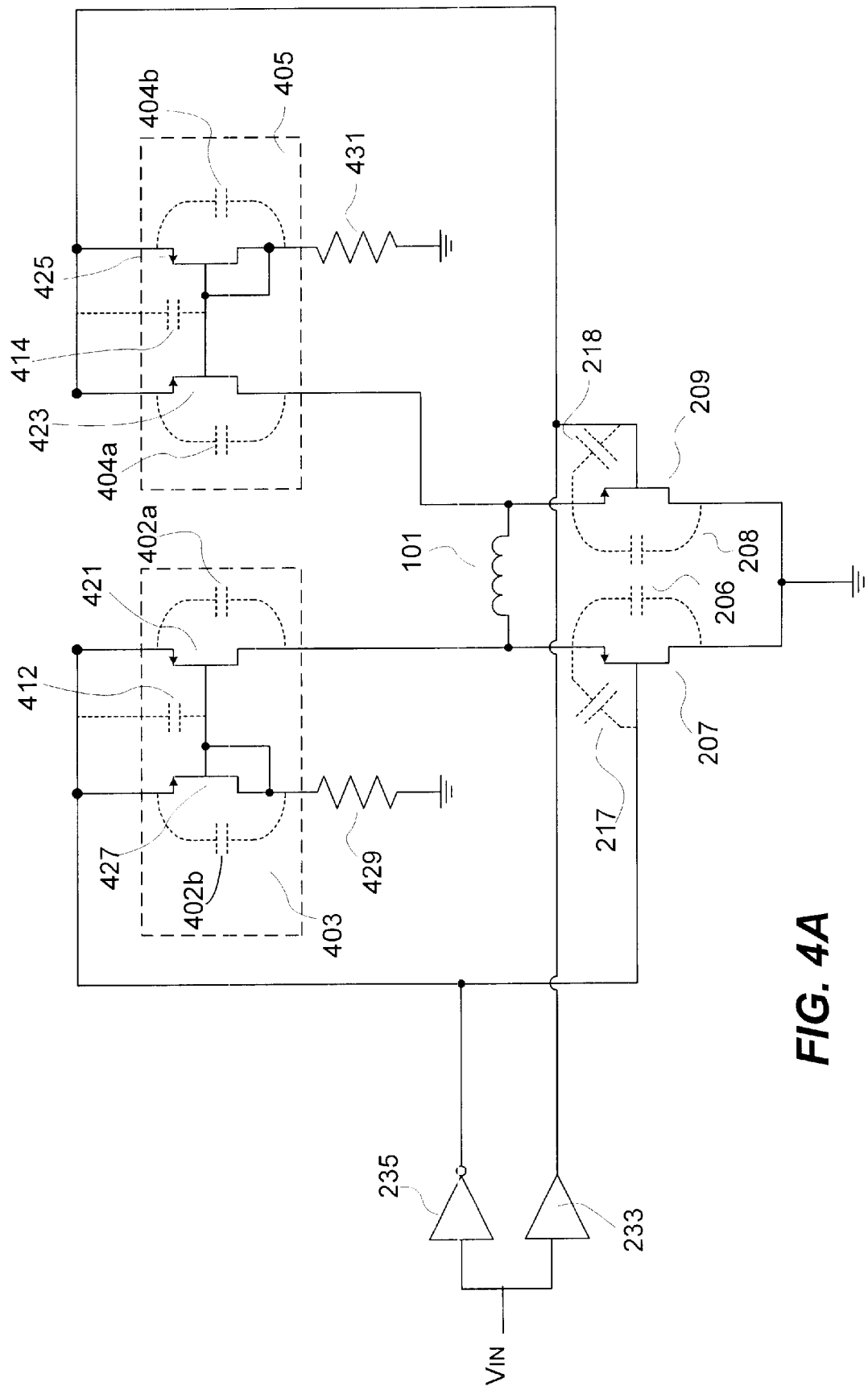
FIG. 4A shows in schematic form a third embodiment driver circuit in accordance with the present invention.

Conventional H-bridge circuits, as well as the embodiments shown in FIG. 2 and FIG. 3, selectively enable the current mirror mechanisms of high-side switches to control current to the load 101. As described in reference to FIG. 1, this configuration places capacitors 102 and 104 in an operational mode where they rob current from load 101 during switching. FIG. 4A illustrates an implementation in which the high side driver switches are configured such that the intrinsic capacitors are placed in a mode in which they support, rather than oppose, desirable current flow to load 101.

As shown in FIG. 4A, the supply voltage Vcc is provided not by a bus rail but instead by the output of either buffer 233 (right high side switch) or inverter 235 (left high side switch). Appropriate modifications to the current sourcing capacity of buffer 233 and inverter 235 should be made. In operation, buffer 233 turns on applying Vcc to source nodes of PMOS drive transistor 423 and PMOS mirror transistor 425. The current through drive transistor 423 rises to a level determined by resistor 431 in a conventional manner. However, because the voltage across capacitor 404a cannot change instantaneously, as Vcc is applied the voltage on the drain of transistor 423 (and the right side of load 101) rises to Vcc immediately before transistor 423 has turned on. As capacitor 404a is charged PMOS transistor 423 turns on to couple the supply voltage Vcc to the right side node of inductor 101.

Another way of looking at the operation of turning on switch 405 to recognize that in prior solutions parasitic capacitor 404a would have been precharged to −Vcc while switch 405 was held in the off state. In the implementation of FIG. 4A capacitor 404a is not charged in the off state. As a result, turning on the high-side switch in the prior art forced a charging period to compensate for the precharge established during the off state. In contrast, the circuit of FIG. 4A does not have to overcome the precharge condition and so Vcc is immediately applied to the load 101.

Switch 403 operates in an analogous manner when turned on by applying Vcc from inverter 235 to the source nodes of PMOS devices 421 and 427. The applied supply voltage is transferred during the transient phase through capacitance 402a to the left side node of load 101.

The mode of operation of the circuit in FIG. 4A can be disconcerting at first. In essence, it is the parasitic devices that are conducting the important transient currents to provide current to the load and not the active devices themselves. However, it has been found that the parasitic devices couple current to the load much faster than the active devices. Intrinsic capacitors 402a and 404a are essentially functioning as charge pumps in the transient period after switching. The implementation of FIG. 4A is configured to place the parasitic devices in an operational mode where they support the desire current switching action rather than oppose it, resulting in higher di/dt applied to load 101.

Figure 4B:
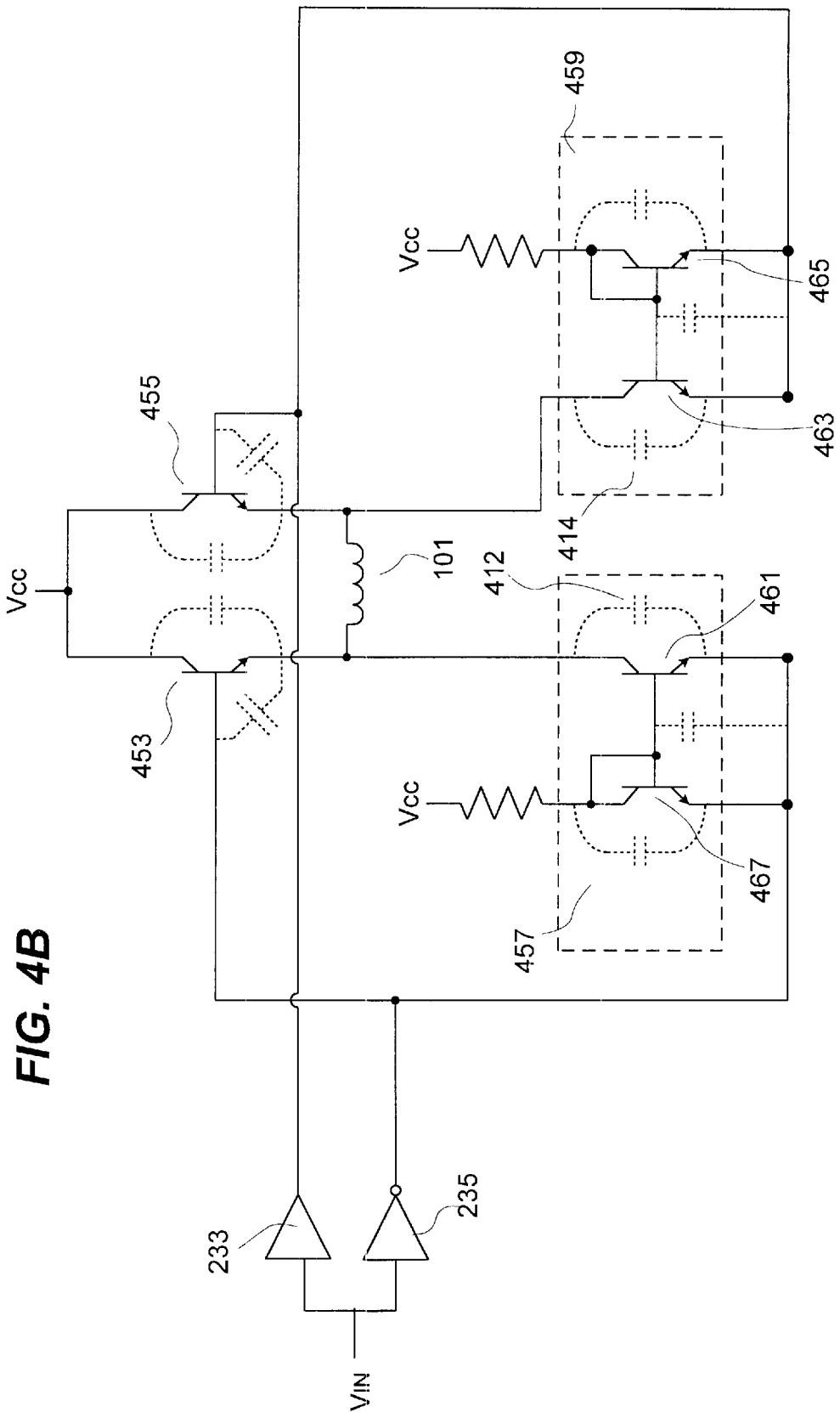
FIG. 4B illustrates a variation of the third embodiment in schematic form.

FIG. 4B shows a variation of the circuit shown in FIG. 4A using NPN bipolar devices to implement the switching elements. N-channel MOS devices can be substituted for the NPN transistors shown in the example of FIG. 4B with predictable changes in performance. NPN or N-channel devices may be preferable in some circumstances because of their inherent faster switching as compared to P-channel devices. Significantly, the circuit shown in FIG. 4B is configured to place the intrinsic capacitance of the NPN switch devices in a configuration in which they aid, rather than oppose, current switching.

The operation of the circuit shown in FIG. 4B is analogous to the circuit of FIG. 4A, and so is described in an abbreviated fashion herein. More detailed understanding of the operation is available by referencing the analogous components described in reference to FIG. 4A. Upper high side driver switches 453 and 455 are turned on in an orthogonal fashion. Upper high side driver switches 453 and 455 are implemented as NPN devices and so are conductive when a logic high voltage (e.g., Vcc) is applied to their gate node. Hence, when device 453 is turned on, the associated base-to-emitter capacitance, shown in phantom in FIG. 4B, pumps charge into load 101 in the direction indicated by the arrow. Device 455 operates in a similar manner when driving charge in the opposite direction through load 101.

Low-side switches 457 and 459 include NPN drive transistors 461 and 463, respectively, and current mirror NPN devices 467 and 465, respectively. Low-side switches 457 and 459 are selectively activated in response to the Vin signal by coupling the source nodes to driver. In this manner, the parasitic collector-emitter capacitance of the low side NPN drivers 461 and 463 serve as charge pumps to aid, rather than oppose, current flow in the desired direction through inductive load 101.

The implementations of FIG. 4A and FIG. 4B still include parasitic capacitors across the mirror devices. Referring to FIG. 4A, capacitors as 402b and 404b must be charged before mirror transistors 427 and 425 become operational, with analogous operation in the implementation of FIG. 4B. Parasitic capacitors 412 and 414 also operate to delay turn on of the current mirror devices. However, turn-off of the current mirrors is no longer controlled by parasitic capacitance as turn-off will occur at the rate at which buffer 233 and inverter 235 can be turned off. The improvement provided by the configuration of drive transistors 421 and 423 compensates or balances out these other parasitic capacitors to improve di/dt performance. Also, gate-source capacitance (217, 218 ) of switches 207 and 209 add a frequency zero which enhances output current slew and compensates for resistive damping. Moreover, flyback voltage generated by the collapsing field of the load inductor increases load voltage and increases output current slew rate.

Figure 5:
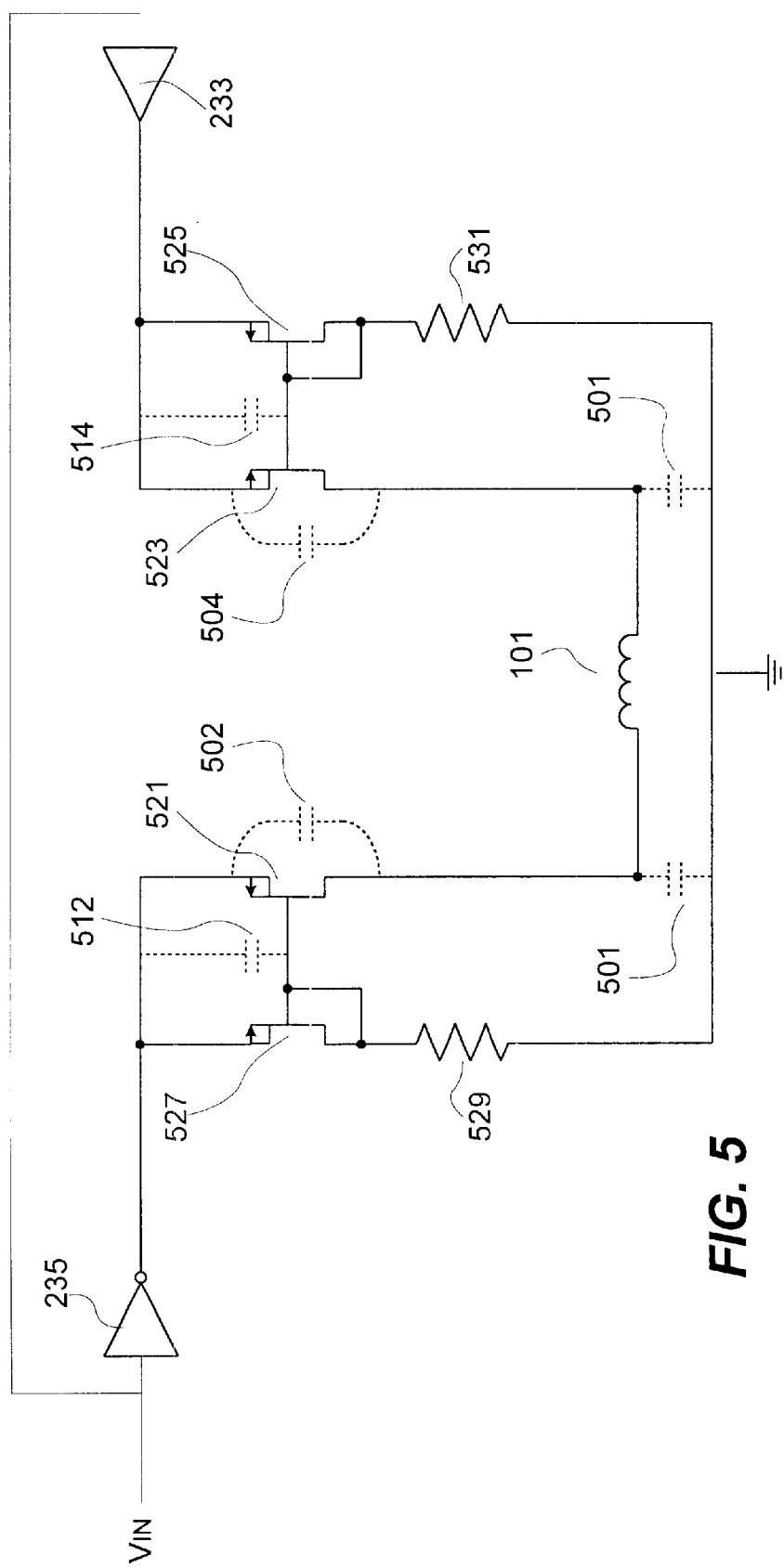
FIG. 5 shows in schematic form a fourth embodiment driver circuit in accordance with the present invention.

FIG. 5 illustrates an elegant implementation of the principles of the present invention. The driver circuit in FIG. 5 appears at first glance to be a push-pull configuration driver.

However, as described below the switch transistors 521 and 523 operate in a dual mode fashion such that the circuit of FIG. 5 is essentially equivalent to an H-bridge configuration. In a first mode, transistor 521 is a high side driver and transistor 523 is a low side driver. In a second mode, transistor 523 is a high side driver and transistor 521 is a low side driver. Despite its simplicity, the advantages of the earlier embodiments of the present invention are retained.

The driver shown in FIG. 5 includes a left side driver transistor 521 and a right side driver transistor 523 both implemented as PMOS devices in the preferred implementation. Significantly, both PMOS devices 521 and 523 are configured at a device level for bi-directional operation. That is to say, both current carrying nodes act as source and drain depending on which phase in the switching process is currently underway. Current mirror transistors 525 and 527 operate to set the steady state current as determined by resistors 531 and 529 respectively.

The implementation of FIG. 5 illustrates a practical feature of write head driver circuits that has not been shown in the earlier implementations to ease description. Namely, the driver circuit outputs connect to the write head through bond pads or other coupling means that introduce some parasitic capacitance such as capacitors 501. Capacitors 501 tend to prevent the voltage from changing across the terminals of load 101 until they are charged after a switch. The values of capacitors 501 are a function of the physical design of the read/write head mechanism and cannot be controlled by the drive circuit manufacturer. However, in the configuration of FIG. 5 intrinsic capacitors 502 and 504 act as charge pumps to compensate for the load current robbed by bond pad capacitors 501.

In the implementation of FIG. 5, while the left side of the circuit shown in FIG. 5 is acting as a high side driver, the right side of the circuit shown in FIG. 5 is acting as a sink or low side driver. Conversely, when the right side of the circuit shown in FIG. 5 is acting as a high side driver, the left side of the circuit shown in FIG. 5 is acting as a sink. While either transistor 521 or transistor 523 is functioning as a low-side driver the associated current mirror transistor is inactive as it has both its source and drain nodes coupled to ground.

Assuming a steady state condition in which current is flowing from left to right through load 101 (e.g., Vin= ground) current through load 101 is constant at the level set by current mirror transistor 527 and resistor 529. In this state, PMOS transistor 521 is functioning as a high side driver while PMOS transistor 523 is functioning as a low side driver switch akin to switch 209 shown in FIG. 2. Transistor 523 functions as a low side driver because its gate is held to ground through resistor 531, and the upper D/S node is held to ground. In this mode, the upper D/S node is functioning as a drain and the lower D/S node is functioning as a source. Hence, transistor 523 is coupled equivalently to transistor 209 shown in FIG. 2 and will operate in a similar manner. Specifically, transistor 523 will operate in a high impedance state during a first phase of switching due to the flyback voltage and charge pump from capacitor 502, and will turn on to sink current during the second phase in which current flows from left to right in load 101.

After switching, current is flowing from right to left through inductor 101, transistor 521 functions as a low side driver because its gate is held to ground through resistor 529, and the upper D/S node is held to ground. In this mode, the upper D/S node of transistor 531 is functioning as a drain and the lower D/S node is functioning as a source. Hence, transistor 521 is coupled equivalently to transistor 207 shown in FIG. 2 and will operate in a similar manner.

Operation of the circuit shown in FIG. 5 is described in terms of an operation switching inductor current from an initial steady state left to right flow to a final steady state right to left flow. In the initial steady state, Vin is LOW making the output of buffer 233 ground and the output of inverter 235 the supply potential Vcc. In steady state, di/dt is zero, therefore both the left and right terminals of load 101 are at a potential above ground by an amount equal to the VDS(on) of the low side PMOS device. Whenever either of transistors 521 or 523 is functioning as a low side driver it will turn on sufficiently to hold its source node at this voltage.

When Vin switches polarity, Vcc is applied to the upper source/drain (S/D) nodes of PMOS devices 523 and 525 and ground is applied to the upper S/D nodes of PMOS devices 521 and 527. The source/drain nodes of transistors 521 and 523 transpose their functionality such that sources become drains and drains become sources.

PMOS devices 521 and 527 turn off quickly because inverter 235 is capable of switching voltage quickly using available technology. Because the voltage across intrinsic capacitor 502 cannot change instantaneously, the left hand terminal of load 101 is pulled toward −Vcc. Bond pad capacitor 521 forms a capacitive divider network with intrinsic capacitor 502 such that the left hand terminal of load 101 cannot go completely to −Vcc, but is instead driven toward a potential (neglecting inductive flyback) determined by the relative values of capacitor 521 and intrinsic capacitor 502:

$$V = -V_{CC}\left[\frac{C_{502}}{C_{501}+C_{502}}\right].$$

Inductive flyback can drive the voltage further negative according to the equation:

$$V_{Flyback} = \sqrt{\frac{L_{101}}{C_{TOTAL}}}$$

The derivation of the equation describing inductive flyback voltage is not necessary for the understanding of the present invention, but is a straightforward expression of the tank circuit formed by inductor 101 and the total capacitance seen a the terminals of inductor 101.

Similarly, the voltage across intrinsic capacitor 504 cannot change instantaneously. Hence, when Vcc is applied the right side terminal of load 101 is pulled toward Vcc to maintain a condition of zero volts across capacitor 504. In this manner the charge pumping action of intrinsic capacitor 504 serves to increase the voltage across load 101 just after switching to a value approaching double the available power supply (Vcc). In turn, the di/dt and slew rate are improved.

As current in load 101 decreases the negative di/dt induces a flyback voltage that turns off transistor 523 during the transient phase by driving its lower S/D node below ground. After the transient phase, di/dt falls to zero, capacitors 502 and 504 charge and transistors 521 and 523 turn on to conduct current from right to left through load 101.

Figure 6:
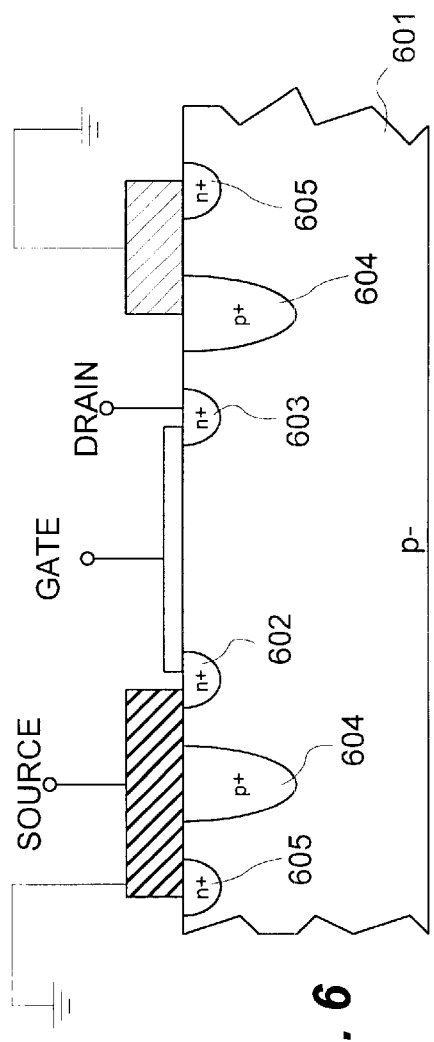
FIG. 6 and FIG. 7 show in cross-section exemplary MOS device structures useful in the practice of the present invention.
Figure 7:
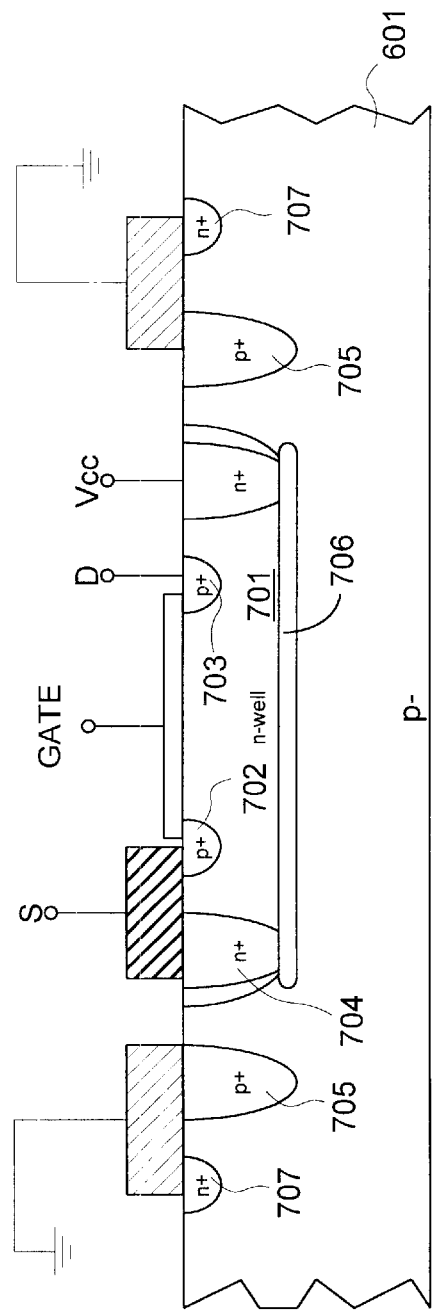

One issue that results from the operation of the present invention is that because voltage across load 101 can have a magnitude greater than Vcc the PMOS transistors must be designed to support higher voltages than may be supported by conventional semiconductor processing. The +/−Vcc generated by the present invention risks device latch up, for example, if conventional five volt CMOS processing is used. The most straightforward way to accomplish this is to change the MOS processing and materials to support higher voltage. However, this is often an unattractive option because of the cost of adding new processes to a manufacturing operation. FIG. 6 and FIG. 7 show MOS device design that provide a higher voltage range to support the +/−Vcc operation described above on a standard and unaltered CMOS or BiCMOS process designed to support 0 to Vcc operation.

The drive transistors 521 and 523 illustrate another feature of the present invention in that the backgate or channel region of each PMOS device is coupled to the source/drain node that is driven by either buffer 233 or inverter 235. Generally accepted design practices tie the back gate to a constant voltage to provide stability and improved switching speed. However, by coupling the back gate to a node that switches between ground and Vcc, the operating voltage range of devices 521 and 523 is extended. Hence, in a 5 V process, when the output of inverter 235 is at ground, the S/D nodes of PMOS device 521 can be between 0 V and −5 V whereas when the output of inverter 235 is at +Vcc, the S/D nodes of PMOS device 521 can range from 0 V to +Vcc. This feature gives a total operating range of −Vcc to +Vcc.

FIG. 6 shows an NMOS device having source, gate, and drain electrodes as indicated. In normal operation, an applied positive gate voltage induces an n-region channel in p− epitaxial layer 601 that couples the source region 602 to drain region 603. A parasitic NPN transistor is formed by drain regions 603 acting as an emitter, the p− epitaxial layer 601 acting as a base, and n+ region 602 acting as a collector. This parasitic NPN is normally off, but can turn on in conventional devices if a high voltage transient condition induces a base current from region 601 to drain region 603. P− region 601 is comparatively high resistively and so small base currents may generate enough voltage to forward bias the base-emitter junction of the parasitic NPN. Once forward biased a destructive collector-emitter current can be generated.

The implementation of FIG. 6 provides a deep P+ region 604 surrounding source and drain regions 602 and 603 that provide a solid ground connection for p− epitaxial layer 601. This deep p+ region 604 decreases the beta of the parasitic NPN transistor and adds to the effective base width decreasing Beta. In addition, an n+ region 605 surrounds the p+ region 604 and is shorted with region 604 to ground. Region 605 serves as a "safe" collector for the parasitic NPN by providing a location for charge to collect that is distanced from drain region 603. Parasitic current flowing in the safe collector 605 will have low tendency to turn on the parasitic NPN.

Introduction of the deep p+ regions 604 adds a parasitic PNP transistor to the structure with region 604 acting as a collector, n+ regions 602 and 605 acting as base, and the p− epitaxial layer region acting as a collector. By heavily doping the p+ region 604 and making it deep, these regions decrease Beta and provide a safe collector for the parasitic PNP to prevent destructive current flow in other unrelated circuits. These features show in FIG. 6 provide a robust, latch resistant NMOS design that is compatible with existing CMOS processing.

FIG. 7 shows an exemplary PMOS implementation that provides complementary robust, latch resistant behavior to that of the structure shown in FIG. 6. A conventional PMOS device comprises a p+ source region 702 and a p+ drain region 703 formed in an N-well 701. Source region 702 and drain region 703 are separated by a channel region covered by a gate electrode. N-well 701 is surrounded by n+ regions including region 704 and buried layer 706 that are coupled to the power supply potential Vcc. Source region 702 is also coupled to the n+ region and to Vcc. During switching, transient current can be forced in through drain region 703 resulting in undesirable forward biasing of a parasitic PNP.

In accordance with the present invention, the n+ regions 704 are surrounded by deep p+ region 705 and an n+ region 707 that provide safe collectors for the parasitic PNP and parasitic NPN respectively. Deep p+ provides a safe collector for the parasitic PNP that is distanced from drain region 703 that can otherwise act as a primary collector for the parasitic PNP. N+ regions 704 and n+ buried layer 706 decrease beta and increase the base area of the parasitic PNP.

The p+ region 705 is coupled to ground and to n+ regions 707. The n+ region 707 provides a safe collector for the parasitic NPN that is distanced from n+ regions 704 that can otherwise act as a primary collector for the parasitic NPN. The deep p+ region 705 also decreases the beta and increases the base area of the parasitic NPN.

In operation, the PMOS structure shown in FIG. 7 can be used to implement transistors 521 and 523 shown in FIG. 7. As will be recalled, these transistors are intended to be bi-directional in that the source and drain nodes exchange roles during depending on the switching state. In a first case, p+ region 702 is acting as a source and is coupled to the power supply voltage Vcc while the p+ region 703 is acting as a drain at a voltage varying from ground to Vcc depending on the phase of the switching process. In this case, epitaxial layer 601 is held at ground and the PN junction formed between n-well 701 (and n+ regions 704 and 706) is reverse biased. Also, the PN junction formed by region 703 and n-well is either reverse biased or at zero volts, but never forward biased, throughout the excursion of drain region 703 from ground to Vcc.

In another case, p+ region 703 is acting as a source and is coupled to the power supply voltage Vcc while the p+ region 702 is acting as a drain at a voltage varying from ground to −Vcc depending on the phase of the switching process. In this case, epitaxial layer 601 is held at ground and the PN junction formed between n-well 701 (and n+ regions 704 and 706) is reverse biased. Also, the PN junction formed by region 702 and n-well is either reverse biased or at zero volts, but never forward biased, throughout the excursion of drain region 702 from ground to −Vcc.

Figure 8:
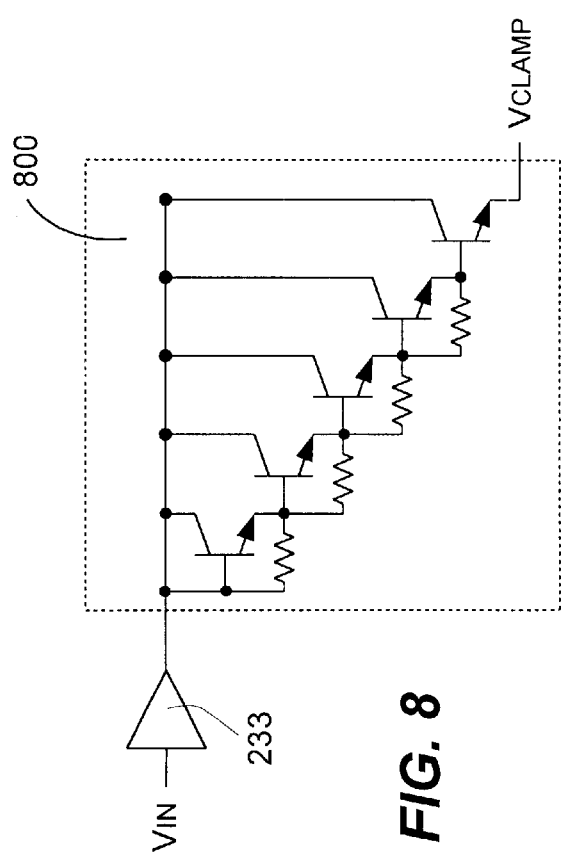
FIG. 8 shows a clamp mechanism useful in the practice of the present invention.
Figure 9:
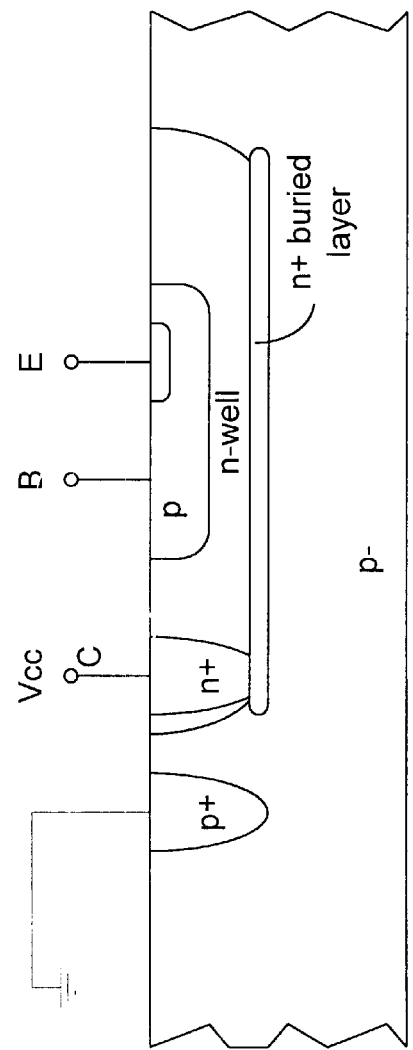
FIG. 9 illustrates in cross-section an exemplary semiconductor device useful in the implementation of the clamp mechanism shown in FIG. 8.

Another desirable feature in practical implementations is to provide a mechanism for clamping the output voltage across the load 101. This requires a structure that can clamp at −Vcc with a range of 2*Vcc that is preferably implemented in a conventional (e.g., 5 volt) BiCMOS process. The mechanism of FIG. 8 provides such a clamp using a transistor design shown in FIG. 9. Clamp 800 using the series connected base-emitter junctions to provide the clamping voltage. Each transistor is coupled so that its emitter couples to the base of the next transistor. The first transistor 801a has a base node coupled to the output of buffer 233 (or inverter 235). The collector of each of transistors 801a–801e are coupled to the output of buffer 233 (or inverter 235). In this manner, the collectors are driven synchronously with the output. The series of base-emitter junctions provides the clamping voltage whereas the collector coupling enables the range to vary from 0 to +Vcc when Vin is a logic high and 0 to −Vcc when Vin is at ground. In either case, all PN junctions in the structure shown in FIG. 9, except for the base-emitter junctions, are either reverse biased or at 0 volts, but never forward biased.

Figure 10:
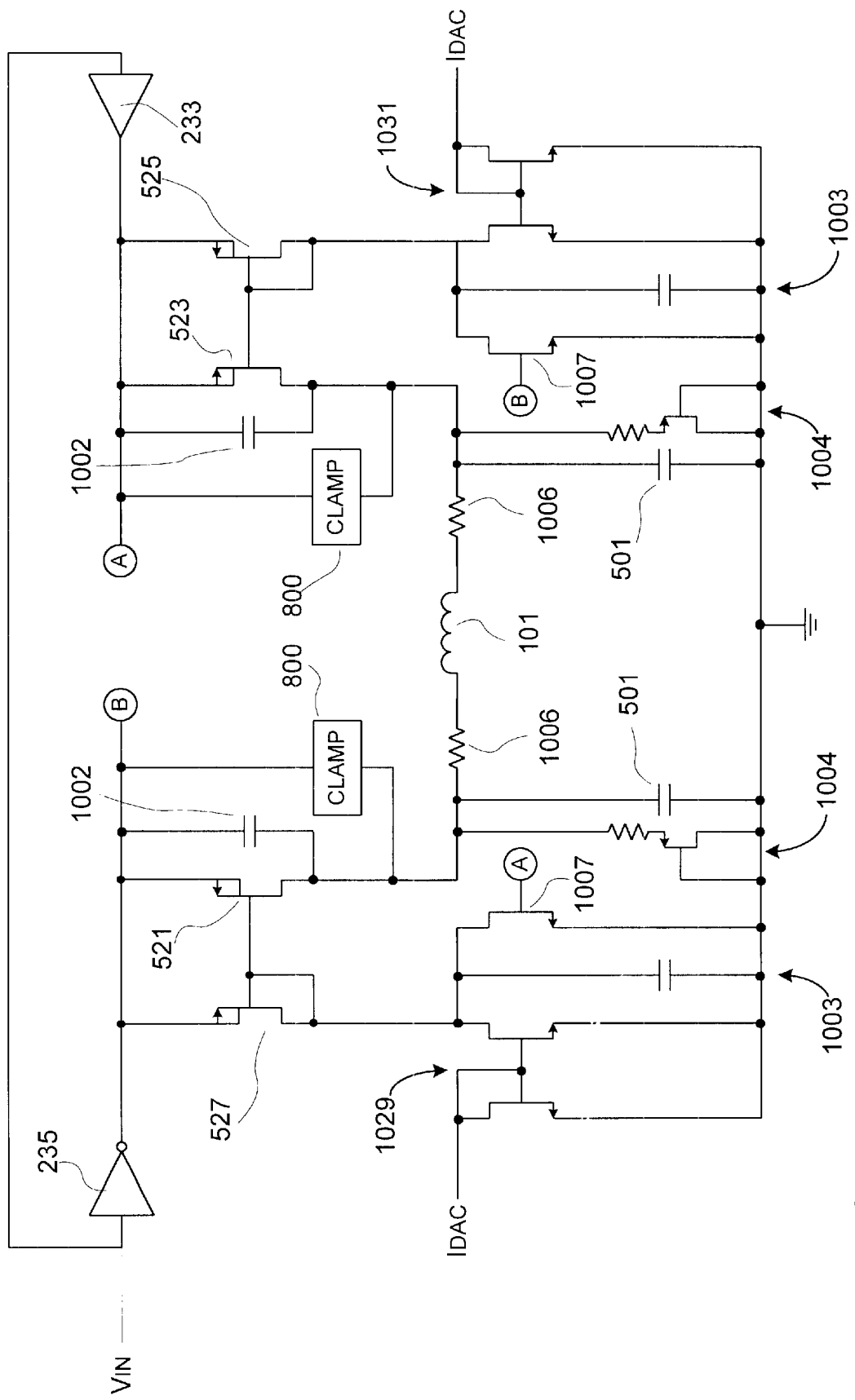
FIG. 10 shows a full circuit implementation of a particular embodiment in accordance with the present invention.

The circuit of FIG. 5 is shown in FIG. 10 implemented in a full circuit used to drive an inductive load 101. Current mirror resistors 529 and 531 are replaced by programmable current sources 1029 and 1031, respectively. A programmable or user-set current output digital-to-analog converter (IDAC) is used to set the current value through current sources 1029 and 1031 so that the load current is programmable to meet the needs of a particular read/write head.

Voltage clamp circuits 800 are coupled with the common collector side coupled to the output of either inverter 235 or buffer 233. The emitter side (labeled Vclamp in FIG. 8) is coupled to the appropriate terminal of the read/write head. Hence, the maximum potential on each read/write head terminal before clamp 800 begins to conduct current is dependent on the switching state (i.e., whether the collector side of clamp 800 is at Vcc or to ground).

Inductive load 101 is associated with parasitic resistors 1006 and bond pad capacitance 501. Bondpad capacitance 501 represents all capacitance associated with load 101 and may lump together other contributing capacitances within a read/write head. The full circuit implementation shown in FIG. 10 includes several optional components that assist in driving a practical load 101 having associated parasitic impedances.

Capacitors 1002 coupled around drivers 521 and 523 are coupled in parallel with the intrinsic drain-source capacitors 502 and 504 (shown in FIG. 1). Capacitors 1002 supply additional charge pumping capability to that provided by the intrinsic capacitors. It should be appreciated that in prior designs it has been an express design goal to minimize the drain-to-source capacitance across the driver transistors. In stark contrast, the present invention has placed the capacitors in a beneficial operating condition such that it may be desirable to increase their value with supplemental pump capacitors such as capacitors 1002 shown in FIG. 10.

A damping mechanism is used to control the overshoot and undershoot characteristics of the drive signal applied to inductor 101. When current is removed from inductor 101 the flyback voltage is theoretically infinite. However, in practical circuits the bondpad capacitance 501 and parasitic resistance 1006 form an RC circuit that damps the peak flyback voltage. FIG. 10 illustrates a damping resistor mechanism 1004 comprising a resistor switched in parallel with the bond pad capacitor 501 by an source-follower coupled PMOS transistor. Current will only flow in damping mechanism 1004 when the driving voltage becomes sufficiently positive to turn on the associated transistor and so affects only the overshoot portion of the drive waveform. The resistor value in the damping resistor mechanism is chosen to over damp the load current to control ringing (i.e., overshoot) caused by bond pad capacitors 501, however, the damping mechanism reduces slew rate as well.

To restore the slew rate lost to the damping mechanism 1004, a boost capacitor 1003 and boost capacitor reset switch 1007 are provided. One node of boost capacitor 1003 is coupled to ground and the other node is coupled to the current mirror transistors 527 and 525 accordingly. When the current mirror 527 is switched on, (e.g., when the output of inverter 235 is switching from ground to Vcc) boost capacitor 1003 draws additional current until charged. This additional current turns the associated drive transistor 521 on more, providing an additional current boost to load 101. Larger values for boost capacitor 1003 will increase the boost current whereas smaller values will decrease the boost current. The current boost will last for a time period determined by the value of boost capacitor 1003, which is chosen to restore the damped output current to a desirable di/dt.

Reset switches 1007 are controlled by the output of inverter 235 or buffer 233 as shown such that when the current mirror device 527 or 525 is not operational the boost capacitor is discharged. In this manner, at the beginning of each turn on cycle a predictable boost current is provided by charging boost capacitor 1003 from zero to a fully charged value.

The value of capacitors 1002 is chosen to balance out bond pad capacitors 501. As discussed hereinbefore, bond pad capacitors 501 act in conjunction with the intrinsic capacitors 502 and 504, as well as pump capacitors 1002 to form a capacitate divider network that limits the charge pumping ability. By providing more capacitance via capacitors 1002, this capacitive divider network can be trimmed to provide a desired level of charge pumping. Increasing the size of capacitors 1002 will tend to increase di/dt in load 101.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. An inductive load driver circuit comprising:
   a first switch that switches between a non-conductive state and a conductive state to selectively apply a first power supply potential to a first side of an inductive load in response to current generated by a control signal; and
   a second switch that switches between a non-conductive state and a conductive state to selectively apply a second power supply potential to a second side of the inductive load in response to the control signal, wherein the control signal drives a control node of the second switch and the control signal is at a lower potential than the second side of the inductive load to sink current from the load while the second switch is in the conductive state.

2. The circuit of claim 1 wherein the second switch comprises a PMOS device.

3. The circuit of claim 1 wherein the second switch comprises a PNP transistor.

4. The circuit of claim 1 wherein the first switch comprises a first current carrying node coupled to the control signal, a second current carrying node coupled to the first side of the inductive load and a control node coupled to a current limit device.

5. The circuit of claim 1 further comprising:
   a third switch that switches between a conductive state and a non-conductive state to couple the first power supply potential to the second side of the inductive load in response to the control signal, the third switch working in opposition to the first switch;
   a fourth switch having a first current carrying node coupled to a first side of the inductive load and a second current carrying node coupled to the second power supply potential, the fourth switch operative to switch between a conductive state and a non-conductive state in response to the control signal, wherein the fourth switch works in opposition to the second switch and the control signal drives a control node of the fourth switch at a lower potential than the first side of the inductive load while the second switch is in the conductive state.

6. The circuit of claim 1 further comprising:
   a node coupled to supply the control signal to the first and second switches having a first mode in which the first power supply potential is coupled to the first switch and the second power supply potential is coupled to the second switch; and a second mode in which the first power supply potential is coupled to the second switch and the second power supply potential is coupled to the first switch, wherein the circuit places both the first and second switches in a non-conductive state in response to the control mechanism change from the first mode to the second mode.

7. The circuit of claim 6 wherein the non-conducting state of the first switch and the second switch occurs during a transient period having a duration determined in part by the inductive load current thereby making the duration of the non-conducting state auto- synchronized with the load current.

8. A method of switching current in an inductive load comprising:
   driving a steady state current in a first direction through the inductive load by current generated by the control signal; placing the nodes of the inductive load in a high impedance state; and
   driving a steady state current in a second direction through the inductive load by the current generated by the control signal.

9. The method of claim 8 wherein the step of placing the nodes in a high impedance state is auto-synchronized with the current in the load.

10. The method of claim 8 further comprising:
   providing a first switch coupled to a first side of the inductive load;
   providing a second switch coupled to a second side of the inductive load;
   during the step of driving in the first direction, sourcing current using the first switch while sinking current using the second switch; and
   during the step of driving in the second direction, sourcing current using the second switch while sinking current using the first switch.

11. The method of claim 10 wherein the step of driving current in the first direction comprises applying a first power supply potential to the first switch and a second power supply potential to the second switch; and
   placing the nodes in a high impedance state comprises applying the second power supply potential to the first switch and the first power supply potential to the second switch.

12. The method of claim 10 further comprising:
   during at least a portion of the driving steps, pumping charge in the direction of current flow in the load using parasitic capacitance of the first switch and second switch.

13. A write head driver mechanism comprising:
   a write head including an inductive element that generates a magnetic field for a recording medium;
   a first switch that switches between a non-conductive state and a conductive state to selectively apply a first power supply potential to a first side of the inductive element in response to current generated by a control signal; and
   a second switch that switches between a non-conductive state and a conductive state to selectively apply a second power supply potential to a second side of the inductive element in response to the control signal;
   wherein the control signal is coupled to the first switch and the second switch so as to pump charge in the inductive element in the direction of the current flow in the switches when the switches are in a conductive state;
   wherein the control signal is at a lower potential than the second side of the inductive load to sink current from the load.

14. The write head driver mechanism of claim 13 wherein the voltage across the inductive element is greater than the difference between the first power supply potential and the second power supply potential as a result of the charge pumping of the inductive element.

15. The write head driver mechanism of claim 13 wherein the first and second switches are PMOS transistors.

16. A current driver circuit for driving a load and associated parasitic capacitance and resistance associated with the load, the driver circuit comprising:
   a first switch that switches between a conductive state and a non-conductive state to selectively source current from a power supply node to a first side of the load in response to a control signal;
   a second switch that switches between a non-conductive state and a conductive state to selectively sink current to a ground node from a second side of the load in response to the control signal;
   a first charge pump capacitance coupled to pump charge from the power supply node to the first node of the load in concert with the first switch, the first charge pump capacitance sized to compensate for parasitic capacitance associated with the load;
   a second charge pump capacitance coupled to pump charge from the power supply node to the second node of the load in concert with the second switch, the second charge pump capacitance sized to compensate for the parasitic capacitance associated with the load;
   a first damping mechanism coupled to the first node of the load and operative to damp an overshoot portion of the load current when the load;
   a second damping mechanism coupled to the second node of the load and operative to damp the overshoot portion of the load current;
   a first current boost mechanism coupled to the first switch to transiently increase the magnitude of current sourced by the first switch in the first operational mode; and
   a second current boost mechanism coupled to the second switch to transiently increase the magnitude of current sourced by the second switch in the second operational mode.

17. An inductive load driver circuit comprising:
   a first switch that switches between a conductive state and a non-conductive state to selectively apply a first power supply potential to a first side of an inductive load in response to a control signal;
   a second switch that switches between a non-conductive state and a conductive state to selectively apply a second power supply potential to a second side of the inductive load in response to the control signal, wherein the control signal drives a control node of the second switch at a lower potential than the second side of the inductive load while the second switch is in the conductive state;
   a control mechanism coupled to supply the control signal to the first and second switches having a first mode in which, the first power supply potential is coupled to the first switch and the second power supply potential is coupled to the second switch; and
   a second mode in which the first power supply potential is coupled to the second switch and the second power supply potential is coupled to the first switch, wherein the circuit places both the first and second switches in a non-conductive state in response to the control mechanism change from the first mode to the second mode.

18. A driver circuit for generating current in an inductive load comprising:

a plurality of current switches coupled to each other and to the inductive load in an H-bridge configuration, wherein each of the switches is operated by current from a control signal and wherein said plurality of current switches operate to change a current direction from a first steady state condition across the inductive load to a second steady state condition across the inductive load, wherein the current from the control signal that is used to operate each of the current switches is supplied to the load in a direction consistent with a desired current direction in the load.

19. The driver circuit of claim 18, wherein said plurality of switches comprises:

a first current switch that switches between a non-conductive state and a conductive state to selectively apply a first current to a first side of the inductive load in response to the control signal; and a second current switch that switches between a non-conductive state and a conductive state to selectively apply a second current to a second side of the inductive load in response to the control signal.

20. The driver circuit of claim 19 wherein at least one of the first and second switches comprises a current mirror.

21. The driver circuit of claim 19 comprising:

a third current switch tat switches between a non-conductive state and a conductive state to couple the first current from the second side of the inductive load in response to the control signal, the third current switch working in cooperation with the first current switch; and a fourth current switch having a first current carrying node coupled to a first side of the inductive load, the fourth current switch operative to switch between a conductive state and a non-conductive state in response to the control signal, wherein the fourth current switch works in opposition to the first current switch and the control signal places a control node of the fourth current switch at a lower potential than the first side of the inductive load while the second current switch is in the conductive state.

22. A write head driver mechanism comprising:

a write head including an inductive element that generates a magnetic field for a recording medium;

a first current switch that switches between a non-conductive state and a conductive state to selectively apply a first current to a first side of the inductive element in response to current generated by a control signal; and a second current switch that switches between a non-conductive state and a conductive state to selectively apply a second current to a second side of the inductive element in response to the current generated by the control signal;

wherein the current from the control signal is supplied to the first current switch and the second current switch so as to pump charge in the inductive element in a direction in which current flow is desired in the load when the current switches are switched to a non-conductive state.

* * * * *